(12) United States Patent
Byun et al.

(10) Patent No.: US 7,952,134 B2
(45) Date of Patent: May 31, 2011

(54) SEMICONDUCTOR MEMORY DEVICE AND METHOD OF FORMING THE SAME

(75) Inventors: Ki-Yeol Byun, Gyeonggi-do (KR);
Chan-Kwang Park, Seoul (KR);
Jae-Hwan Moon, Suwon-si (KR);
Tae-Wan Lim, Suwon-si (KR);
Seung-Ah Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 198 days.

(21) Appl. No.: 12/286,760

(22) Filed: Oct. 2, 2008

(65) Prior Publication Data

US 2009/0102009 A1 Apr. 23, 2009

(30) Foreign Application Priority Data

Oct. 2, 2007 (KR) .................. 10-2007-0099406

(51) Int. Cl.
*H01L 29/788* (2006.01)
(52) U.S. Cl. ........... 257/316; 257/E29.02; 257/E21.209; 438/257; 438/424
(58) Field of Classification Search .......... 257/314–316, 257/E29.02, E29.209, E21.209; 438/257, 438/424
See application file for complete search history.

(56) References Cited

U.S. PATENT DOCUMENTS

| 6,403,421 | B1 * | 6/2002 | Ikeda et al. ............... 438/267 |
| 6,580,117 | B2 * | 6/2003 | Shimizu .................... 257/315 |
| 7,049,653 | B2 * | 5/2006 | Matsui et al. ............. 257/315 |
| 2005/0002231 | A1 * | 1/2005 | Ozawa et al. .......... 365/185.01 |
| 2007/0023815 | A1 * | 2/2007 | Oh et al. .................. 257/314 |

FOREIGN PATENT DOCUMENTS

| KR | 10-2007-0000148 A | 1/2007 |
| KR | 10-2007-0002489 A | 1/2007 |
| KR | 10-2007-0036960 A | 4/2007 |

* cited by examiner

*Primary Examiner* — Wael M Fahmy
*Assistant Examiner* — John C Ingham
(74) *Attorney, Agent, or Firm* — Mills & Onello LLP

(57) ABSTRACT

Provided are a semiconductor device and a method of forming the semiconductor device. The semiconductor device includes an active region of which an edge is curved. The semiconductor device includes a gate insulating layer, a floating gate, a gate interlayer dielectric layer and a control gate line on the active region. The semiconductor device includes an oxide pattern having a concave top surface between adjacent floating gates. The control gate may be sufficiently spaced apart from the active region by the oxide pattern. The method can provide a semiconductor device that includes a reoxidation process, an active region having a curved edge and an oxide pattern having a top surface of a curved concave shape.

12 Claims, 13 Drawing Sheets

SEMICONDUCTOR MEMORY DEVICE AND METHOD OF FORMING THE SAME

CROSS-REFERENCE TO RELATED APPLICATIONS

This U.S. non-provisional patent application claims priority under 35 U.S.C. §119 of Korean Patent Application No. 10-2007-099406, filed in the Korean Intellectual Property Office on Oct. 2, 2007, the entire contents of which are hereby incorporated by reference.

BACKGROUND OF THE INVENTION

The present invention described herein relates to semiconductor device and method of forming the same, and more particularly, to a nonvolatile memory device and a method of forming the same.

Non-volatile memory devices are semiconductor devices which retain their stored data even when their power supplies are interrupted. Non-volatile memory devices are widely used in, for example, memory cards of computers. With the advance in communication technology, a requirement for a mass storage device increases and various studies of non-volatile memory devices are being performed.

A unit cell of a non-volatile memory device has a structure in which a floating gate, a gate interlayer dielectric layer and a control gate are sequentially stacked. A tunnel insulating layer through which charges pass to write data into the unit cell and erase data from the unit cell is disposed between the floating gate and the device substrate. A write operation and an erase operation of a non-volatile memory device are performed by the Fouler-Nodheim (FN) tunneling method. If lattice damage is present on a surface of the substrate, charges may be trapped in interfaces of the substrate and the tunnel insulating layer during a write operation and an erase operation of the non-volatile memory device, and a difference between a write threshold voltage and an erase threshold voltage may decrease as the write operation and the erase operation are repeated. Thus, a margin that can determine whether a unit cell is in a write operation or in an erase operation may decrease.

In a non-volatile memory device, a device isolation region is formed using a shallow trench isolation (STI) process to define an active region. In the STI process, a plasma etching process may be performed on a substrate so as to form a trench. When a plasma etching process is performed, lattice damage due to physical stress may occur on an inner wall of the trench. That is, the lattice damage occurs on an edge of an active region adjacent to a trench. If a tunnel insulating layer is formed on an active region, a tunnel insulating layer formed on a lattice damaged edge of the active region may be shallower than a tunnel insulating layer formed on a center of the active region. An electric field is concentrated on an edge of an active region which has a relatively shallow tunnel insulating layer during a write operation and an erase operation, resulting in degradation of the reliability of the device. As a design rule of a semiconductor device decreases, a width of an active region reduces and a ratio of an edge of the active region increases. Thus, reliability of the device is further degraded.

As a design rule of a semiconductor device decreases, a space between adjacent floating gates may be filled with a control gate so as to prevent interferences between adjacent floating gates. If a space between a control gate and a substrate decreases, a space between the control gate and an active region decreases, resulting in generation of a leakage current. As a cycle of a write operation and an erase operation is repeated, data retention capability may be further degraded.

SUMMARY OF THE INVENTION

According to a first aspect, some embodiments of the invention provide a semiconductor device. The device may include a conductive line on a substrate extending in a direction that crosses active regions defined by a device isolation insulating pattern in the substrate; conductive patterns disposed on a position at which the active regions and the conductive line cross each other; a first insulating layer disposed between the conductive patterns and the active regions; a first oxide pattern disposed on a lower sidewall of the conductive patterns; a second oxide pattern that is in contact with the first oxide pattern and disposed on the device isolation insulating pattern; and a second insulating layer disposed between the conductive patterns and the conductive line, between the first oxide pattern and the conductive line, and between the second oxide pattern and the conductive line.

In one embodiment, the first oxide pattern includes a thermal oxide layer or a radical oxide layer. In one embodiment, the second oxide pattern includes a chemical vapor deposition oxide layer.

In one embodiment, a density of the second oxide pattern is lower than a density of the first oxide pattern, and the first and second oxide patterns have concavely curved top surfaces on the device isolation insulating pattern.

In one embodiment, a top edge of the active region which faces the device isolation insulating pattern has a curved shape.

In one embodiment, a portion of an upper side of the active regions is exposed by the device isolation insulating pattern.

In one embodiment, an upper side of the active regions is covered with the device isolation insulating pattern.

In one embodiment, on the device isolation insulating pattern, the first and second oxide patterns have concavely curved top surfaces, and a vertical distance between the most concave top surface and the first insulating layer is within 10 nm.

In one embodiment, on the device isolation insulating pattern, the first and second oxide patterns have concavely curved top surfaces, and the most concave top surface and the first insulating layer have a same height.

According to another aspect, some embodiments of the invention provide a method of forming a semiconductor device. The method may include providing a substrate including a first insulating layer and conductive patterns stacked on active regions which are defined by a device isolation insulating pattern and extend in a specific direction; performing an oxidation process to form a first oxide layer on a surface of the conductive patterns; forming a second oxide layer between the conductive patterns; performing a recess process on the first and second oxide layers to form a first oxide pattern and a second oxide pattern on the device isolation insulating pattern; and forming a second insulating layer and a conductive layer on the conductive patterns, the first oxide pattern and the second oxide pattern.

In one embodiment, performing the oxidation process comprises performing a thermal oxidation process, the thermal oxidation oxidizing an edge of the active regions.

In one embodiment, performing the oxidation process comprises performing a radical oxidation process, the radical oxidation oxidizing an edge of the active regions.

In one embodiment, a portion of an upper side of the active regions is exposed.

In one embodiment, an upper side of the active regions is covered with the device isolation insulating pattern.

In one embodiment, providing the substrate comprises: forming a trench in the substrate by recessing the substrate using a mask pattern; forming a device isolation insulating layer having the same height as the mask pattern and filling the trench; removing the mask pattern to expose the active regions; forming the first insulating layer on the active regions; forming the conductive patterns on the first insulating layer; and forming the device isolation insulating pattern by recessing the device isolation insulating layer to expose sidewalls of the conductive patterns. In one embodiment, forming the device isolation insulating pattern comprises etching the device isolation insulating layer so that a recessed surface of the device isolation insulating layer is lower than a top surface of the active regions. In one embodiment, removing the mask pattern to expose the active region comprises forming an opening having a width greater than a width of the mask pattern.

In one embodiment, forming the second oxide layer comprises a chemical vapor deposition process. In one embodiment, forming the second oxide layer comprises an annealing process.

In one embodiment, performing the recess process comprise etching the second oxide layer faster than the first oxide layer.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF PREFERRED EMBODIMENTS

Figure 1:
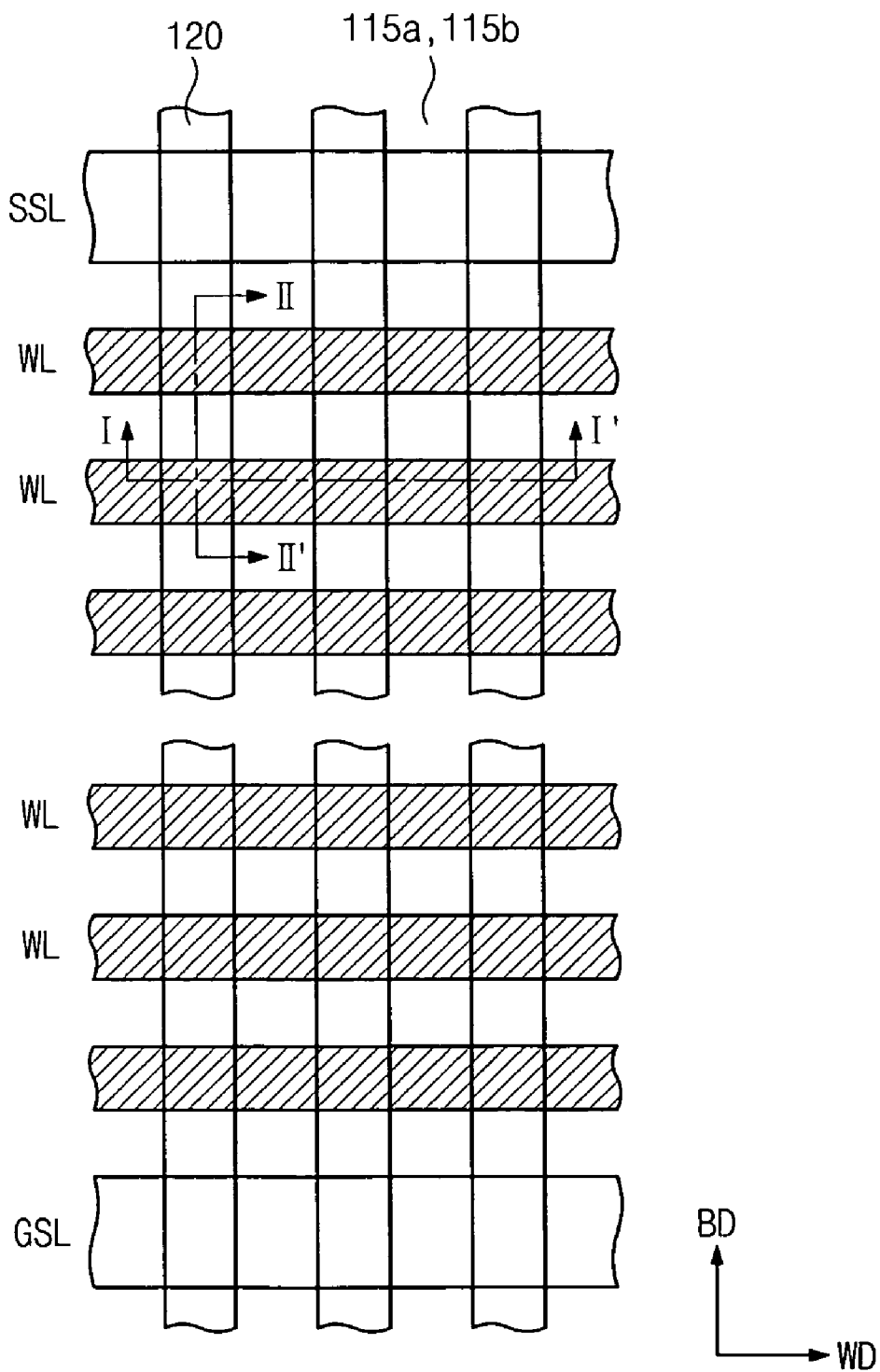
FIG. 1 is a plan view of a semiconductor device in accordance with some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the size and relative sizes of layers and regions may be exaggerated for clarity. Like numbers refer to like elements throughout.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

As used herein, the term "and/or" includes any and all combinations of one or more of the associated listed items and may be abbreviated as "/".

Figure 2:
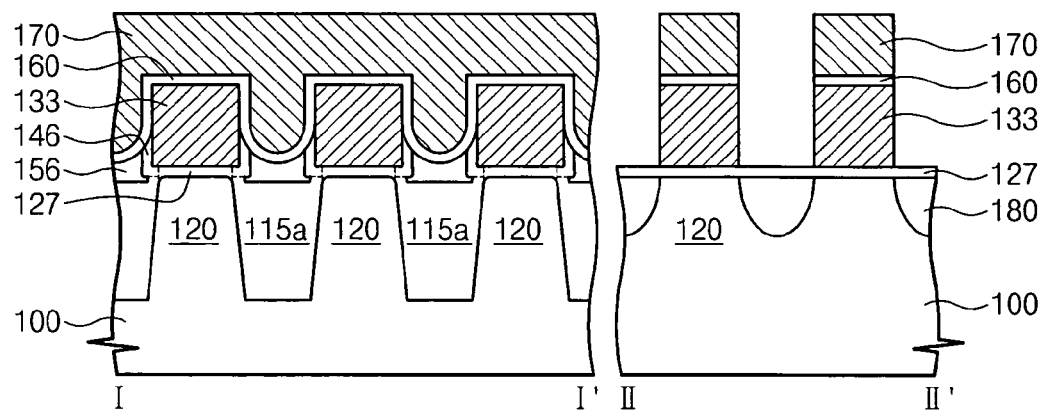
FIGS. 2 and 3 are cross-sectional views of a semiconductor device taken along the lines I-I' and II-II' of FIG. 1 in accordance with some embodiments of the present invention.
Figure 3:
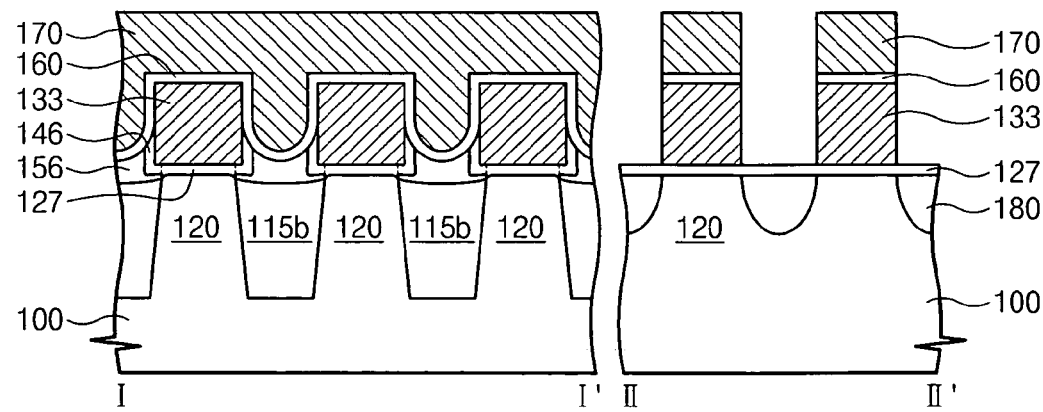

Referring to FIGS. 1 through 3, a semiconductor device in accordance with some embodiments of the present invention will be described.

Referring to FIGS. 1 and 2, active regions 120 may be defined by a device isolation insulating pattern 115a on a substrate 100. The active regions 120 may extend in a first direction (BD) on the substrate 100. Control gate lines 170 constituting word lines (WL) may extend in a second direction (WD) crossing the first direction (BD). That is, the control gate lines 170 may cross the active regions 120. A string selection line (SSL) and a ground selection line (GSL) may extend in the second direction (WD). A series of the word lines (WD) are disposed between the string selection line (SSL) and the ground selection line (GSL).

Floating gates 133 may be disposed on positions where the active regions 120 and the control gate lines 170 cross each other. The floating gates 133 may have a width greater than the active regions 120 that are in contact with bottom surfaces of the floating gates 133.

A first oxide pattern 146 may be provided to a lower sidewall of each of the floating gates 133. A second oxide pattern 156 of which a side surface is in contact with the first oxide pattern 146 may be provided on the device isolation insulating pattern 115a. For instance, the first and second oxide patterns 146 and 156 may share a top surface and the top surface may have a concave shape. On the device isolation insulating pattern 115a, the first and second oxide patterns 146 and 156 may have heights that are gradually reduced as they extend outward (i.e. toward the second direction (WD)) from the sidewall of the floating gates 133. A vertical distance from the most concave top surface of the second oxide pattern 156 to a top surface of a gate insulating layer 127 may be zero to about ten nm. The distance may be decided considering process efficiency, interference between the floating gates 133 and a distance between the oxide patterns 146 and 156 and the active regions 120. A density of the second oxide pattern 156 may be lower than a density of the first oxide pattern 146. For instance, the second oxide pattern 156 may include a chemical vapor deposition (CVD) oxide layer and the first oxide pattern 146 may include a radical oxide layer.

A top surface of the device isolation insulating pattern 115a may include an edge region which overlaps with the first oxide pattern 146 and an exposed region which does not overlap with the first oxide pattern 146. The exposed region may be lower than a top surface of the active region 120. An edge region of the device isolation insulating pattern 115a that is in contact with the active regions 120 in the second direction (WD) may protrude upward from the top surface of the device isolation insulating pattern 115a to cover an upper side of the active region 120.

The gate insulating layer 127 may be disposed between the floating gates 133 and the active regions 120. The gate insulating layer 127 may be uniformly disposed along the top surface of the active regions 120. For instance, an edge of the active region 120 that is in contact with the device isolation insulating pattern 115a in the second direction (WD) may have a curved shape. Thus, an effective channel width due to the gate insulating layer 127 may become greater as compared with when the edge of the active region 120 is sharp.

A gate interlayer dielectric layer 160 may be disposed between the floating gates 133 and the control gate lines 170, between the first oxide patterns 146 and the control gate lines 170, and between the second oxide patterns 156 and the control gate lines 170. The gate interlayer dielectric layer 160 may be conformally formed along the floating gates 133, the first oxide patterns 146 and the second oxide patterns 156. Thus, between the adjacent floating gates 133, the gate interlayer dielectric layer 160 may have a concavely curved region along the profile of the top surfaces of the first and second oxide patterns 146 and 156. As a result, the control gate line 170 on the gate interlayer dielectric layer 160 may sufficiently cut off gaps between the adjacent floating gates 133 and may have a sufficient distance from the active region 120.

An impurity region 180 may be disposed in the active region 120 under the floating gate 133 and the control gate line 170 which are stacked.

Referring to FIGS. 1 and 3, a semiconductor device in accordance with some embodiments of the present invention will be described. The description of common features already discussed above will not be repeated.

Floating gates 133 may be disposed on positions where the active regions 120 and the control gate lines 170 cross each other. The floating gates 133 may have a width greater than the active regions 120 that are in contact with bottom surfaces of the floating gates 133.

A first oxide pattern 146 may be provided to a lower sidewall of the floating gates 133. A second oxide pattern 156 of which a side surface is in contact with the first oxide pattern 146 may be provided on the device isolation insulating pattern 115b. For instance, the first and second oxide patterns 146 and 156 may share a top surface and the top surface may have a concave shape. A density of the second oxide pattern 156 may be lower than a density of the first oxide pattern 146. For instance, the second oxide pattern 156 may include a chemical vapor deposition (CVD) oxide layer and the first oxide pattern 146 may include a radical oxide layer or a thermal oxide layer.

A top surface of the device isolation insulating pattern 115b may be lower than a top surface of the active region 120. Thus, a portion of an upper side of the active region 120 may be exposed.

A gate interlayer dielectric layer 160 may be disposed between the floating gates 133 and the control gate lines 170, between the first oxide patterns 146 and the control gate lines 170, and between the second oxide patterns 156 and the control gate lines 170. The gate interlayer dielectric layer 160 may be conformally formed along the floating gates 133, the first oxide patterns 146 and the second oxide patterns 156. As a result, the control gate line 170 on the gate interlayer dielectric layer 160 may sufficiently cut off gaps between the adjacent floating gates 133 and may have a sufficient distance from the active region 120.

In the above embodiments, the semiconductor device may include a peripheral region and interconnection lines such as bit lines and contact holes.

Referring to FIGS. 4 through 15, a method of forming a semiconductor device in accordance with some embodiments of the present invention will be described.

Figure 4:
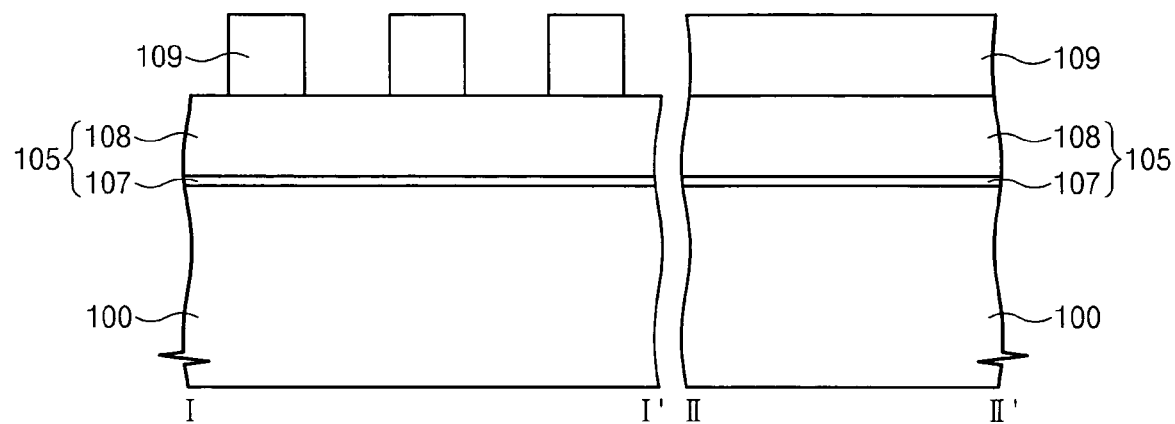
FIGS. 4 through 13 are cross-sectional views, taken along lines I-I' and II-II' of FIG. 1, illustrating a method of forming a semiconductor device of FIG. 2 in accordance with some embodiments of the present invention.

Referring to FIG. 4, a mask layer 105 is formed on a semiconductor substrate 100. The mask layer 105 may include a pad oxide layer 107 and a mask nitride layer 108. A photoresist pattern 109 may be formed on the mask layer 105. The photoresist pattern 109 may be formed using a photolithography process. The semiconductor substrate 100 may include a well formed by an ion implantation process. The semiconductor substrate 100 may include a cell region and a peripheral region, and the mask layer 105 may be formed on both the cell region and the peripheral region.

Figure 5:
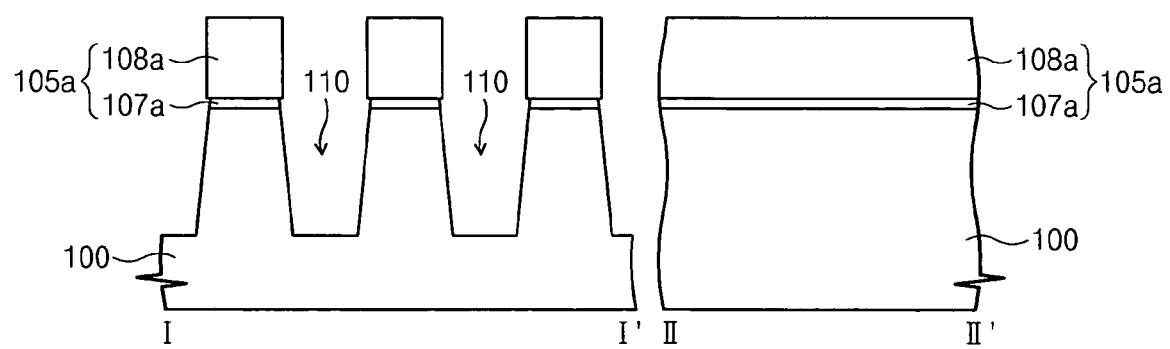

Referring to FIG. 5, the mask layer 105 is patterned using the photoresist pattern 109 to form a mask pattern 105a. The mask pattern 105a may include a pad oxide pattern 107a and a mask nitride pattern 108a. The semiconductor substrate 100 is etched using the mask pattern 105a to form a trench 110. The trench 110 may be formed using an anisotropic etching process and more specifically, formed using a plasma etching process. The photoresist pattern 109 may be removed before or after the trench 110 is formed.

Figure 6:
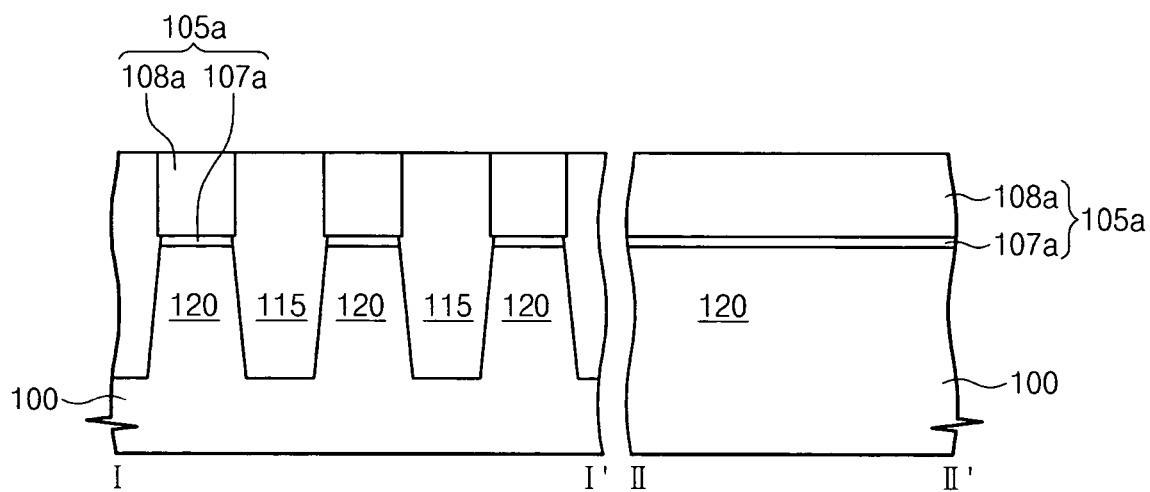

Referring to FIG. 6, an insulating layer (not shown) may be formed on the trench 110 and the substrate 100. The insulating layer may include a silicon oxide layer formed using a chemical vapor deposition (CVD) method. The insulating layer may be planarized down to a top surface of the mask pattern 105a. The planarization process may be a chemical mechanical polishing (CMP) process. By the planarization process, a device isolation layer 115 having a top surface that is even with a top surface of the mask pattern 105a and filling the trench may be formed. An active region 120 may be defined by the device isolation layer 115.

Figure 7:
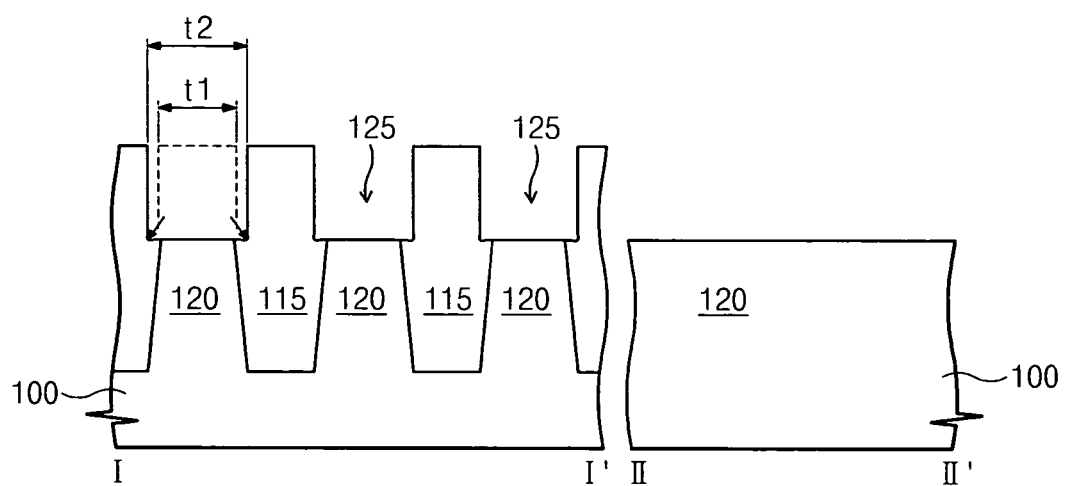

Referring to FIG. 7, the mask pattern 105a may be removed to form an opening 125 that exposes the active regions 120. While the mask pattern 105a is removed, a sidewall of the device isolation layer 115 may be eroded, so that a width (t2) of the opening 125 may be greater than a width (t1) of the mask pattern 105a. The mask pattern 105a may be selectively removed using an etching process having an etching selectivity with respect to oxide material so that nitride material may be removed faster than oxide material. The etching process may be an isotropic etching. After the mask nitride pattern 108a is removed, the pad oxide pattern 107a may be removed. The device isolation layer 115 may be recessed in a corner direction and a side direction of the opening 125 according to the extent of etching during the pad oxide pattern 107a is removed.

Figure 8:
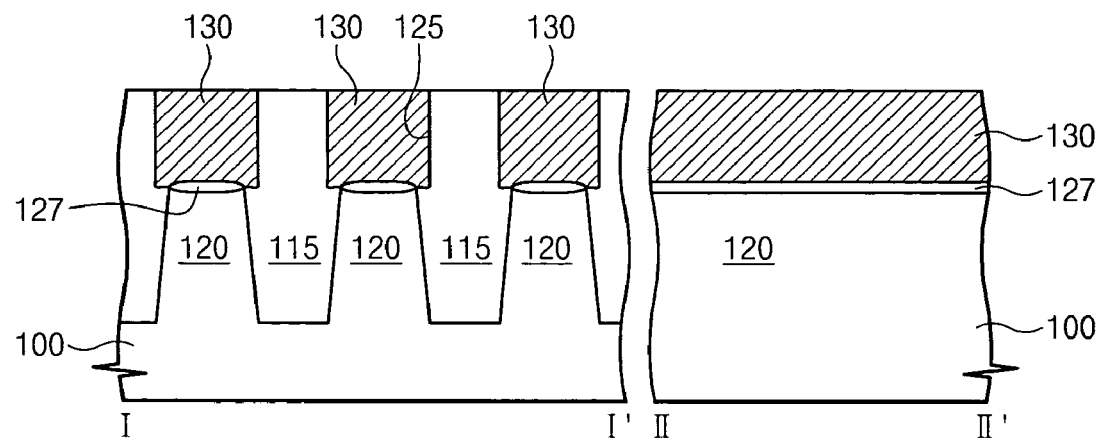

Referring to FIG. 8, a gate insulating layer 127 may be formed on the active region 120 exposed by the opening 125. The gate insulating layer 127 may be relatively thin on an edge of the active region 120 compared with other regions. This may be due to a damage of the plasma during formation of the trench. The gate insulating layer 127 may be formed using a thermal oxidation process. A first conductive layer (not shown) that fills the opening 125 may be formed on the gate insulating layer 127. The first conductive layer may include doped silicon, metal and/or silicide material. The first conductive layer is planarized down to a top surface of the device isolation layer 115 to form a first conductive pattern 130 filling the opening 125. The first conductive pattern 130 may have a width equal to the width (t2) of the opening 125.

Figure 9:
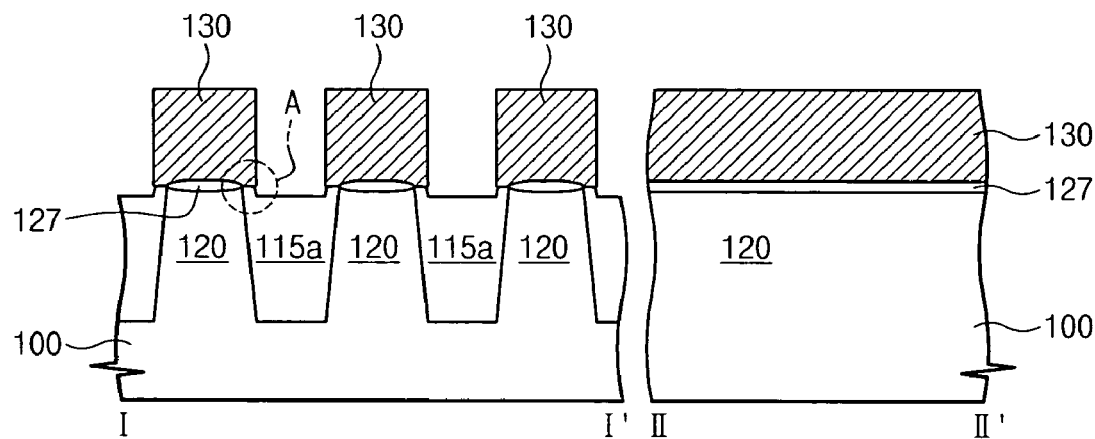
Figure 14:
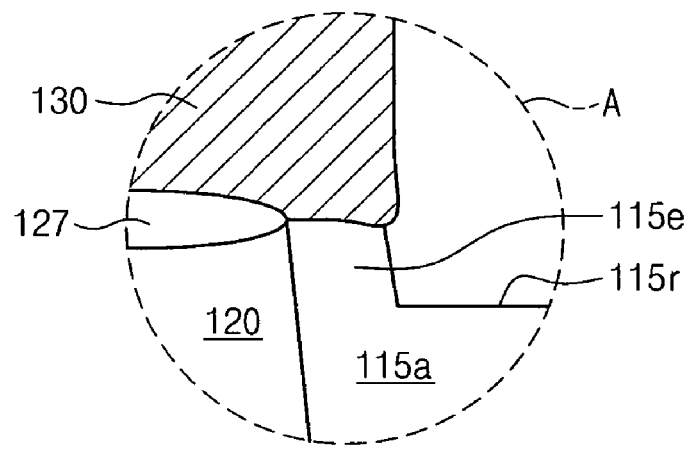
FIG. 14 is an enlarged view of Region A in FIG. 9.

Referring to FIGS. 9 and 14, the device isolation layer 115 is recessed to expose a sidewall of the first conductive pattern 130. The recess process may include an anisotropic etching process and a device isolation insulating pattern 115a may be formed by the recess process. The device isolation insulating 115a may include a recessed surface 115r by the recess process and the recessed surface 115r may be lower than a top surface of the active region 120.

Since a width of the first conductive pattern 130 may be greater than a width of the active region 120, the first conductive pattern 130 may overlap with a portion of the device isolation insulating pattern 115a. An edge region 115e of the device isolation insulating pattern 115a which is overlapped may be higher than the recessed surface 115r. Thus, an upper side of the active region 120 may be covered with the device isolation insulating pattern 115a.

Figure 10:
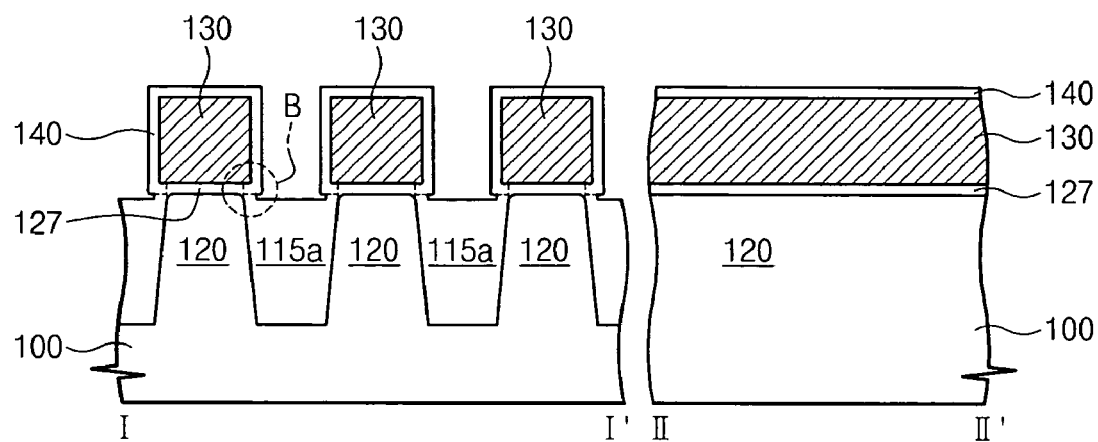
Figure 15:
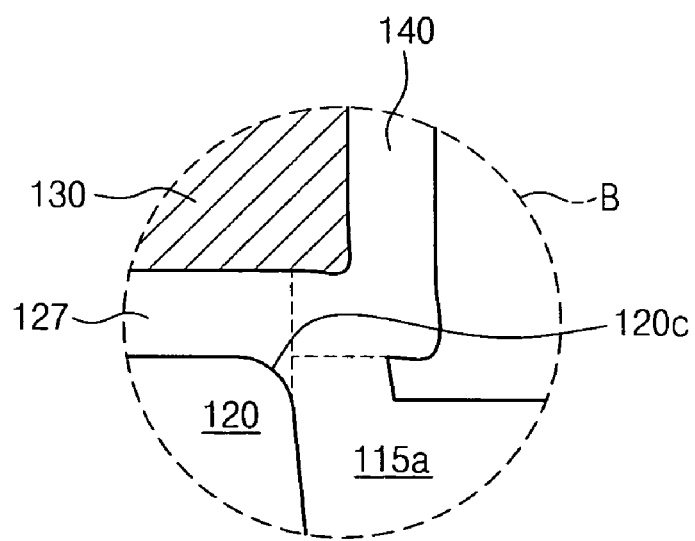
FIG. 15 is an enlarged view of Region B in FIG. 10.

Referring to FIGS. 10 and 15, a radical oxidation process may be performed on a resultant structure formed by the above process. By the radical oxidation process, a first oxide layer 140 may be uniformly formed on a surface of the first conductive pattern 130 and an edge of the active region 120 may be oxidized. Thus, the active region 120 may have a curved edge 120c.

The substrate may be oxidized by the radical oxidation regardless of a silicon crystal lattice direction. Even if the edge of the active region 120 has a lattice damaged by the etching process, the substrate is easily oxidized. That is, even if a thickness of the gate insulating layer 127 on the edge of the active region 120 is thin, the thickness of the gate insulating layer 127 may be compensated by the radical oxidation. Even if the edge of the active region 120 is covered with the device isolation insulating pattern 115a, the edge of the active region 120 may be oxidized because of a superior reactivity of the radical oxidation. An oxygen ($O_2$) gas and a hydrogen ($H_2$) gas may be provided to perform the radical oxidation process. The substrate 100 may be in the range of about 6000° C. to 1200° C. A temperature range may be controlled considering an oxidation speed. If the oxygen ($O_2$) gas and the hydrogen ($H_2$) gas react to each other, a radical such as H*, O*, OH* or the like may be generated. The oxidation process may be easily performed regardless of a crystal lattice direction of the substrate by using the radical. The radical oxidation process may be performed in a single wafer type equipment or batch type equipment.

Figure 11:
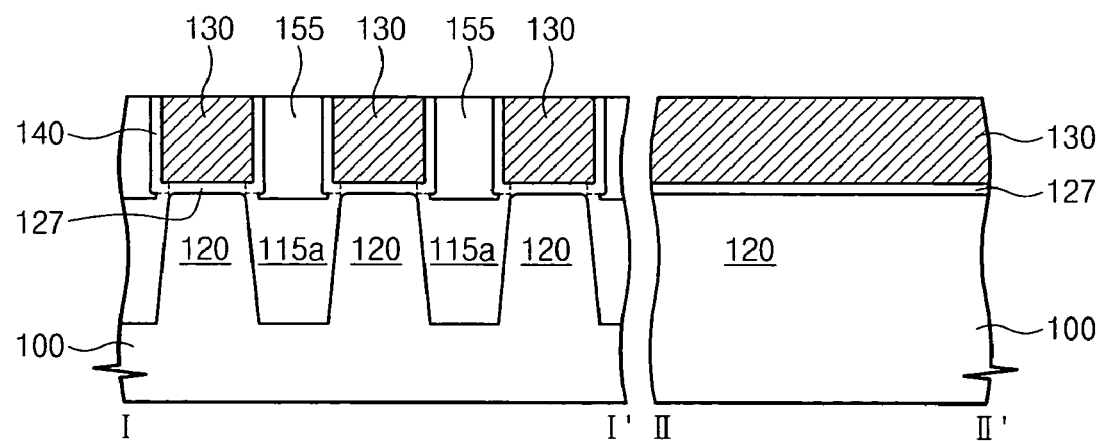

Referring to FIG. 11, a second oxide layer (not shown) filling a gap between the first conductive patterns 130 may be formed on the first oxide layer 140 and the device insulating pattern 115a. A top surface of the second oxide layer may be higher than a top surface of the first conductive pattern 130. The second oxide layer may be formed using a chemical vapor deposition (CVD) method. The second oxide layer may be planarized down to a top surface of the first conductive pattern 130.

Figure 12:
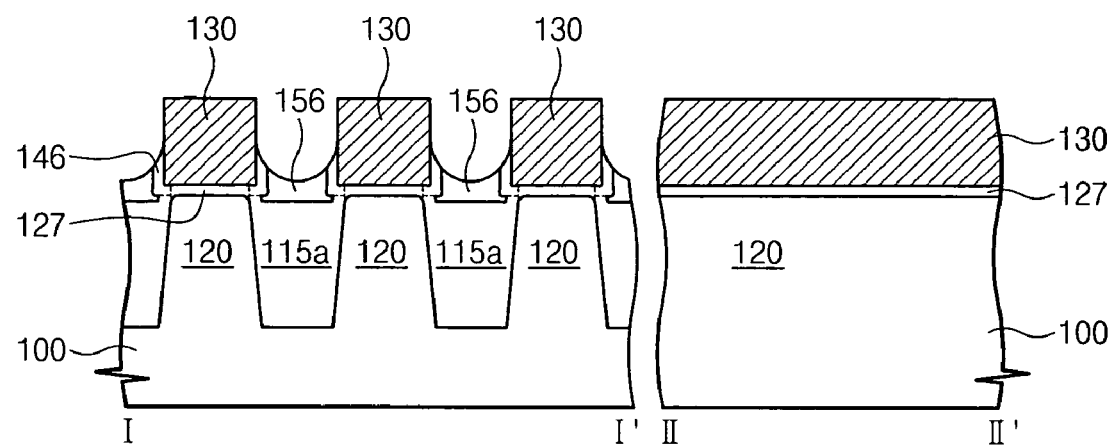

Referring to FIG. 12, the first oxide layer 140 and the planarized second oxide layer 155 are etched to form a first oxide pattern 146 and a second oxide pattern 156 sharing a top surface of a concave shape. That is, on the device isolation insulating pattern 115a, the first and second oxide patterns 146 and 156 may have heights that are gradually reduced as they proceed outward (i.e. toward the second direction (WD)) from the sidewall of the first conductive pattern 133. A vertical distance from the most concave top surface of the second oxide pattern 156 to a top surface of a gate insulating layer 127 may be zero to about ten nm. The distance may be decided considering a process efficiency, an interference between the first conductive patterns and a distance between the oxide patterns 146 and 156 and the active region 120.

The etching process may be performed to have a high etching selectivity with respect to the planarized second oxide layer 155. That is, the planarized second oxide layer 155 may be etched faster than the first oxide layer 140 by the etching process. An etching speed of the planarized second oxide layer 155 may be altered according to whether the planarized second oxide layer 155 is annealed or not. The planarized second oxide layer 155 becomes dense by an annealing and may be etched slowly compared with when the planarized second oxide layer 155 is not annealed. The etching process may be a dry etching or a wet etching. The dry etching may be performed using an etching gas such as $CHF_3$ and $C_4F_6$, and the wet etching may be performed using an etchant such as HF.

Figure 13:
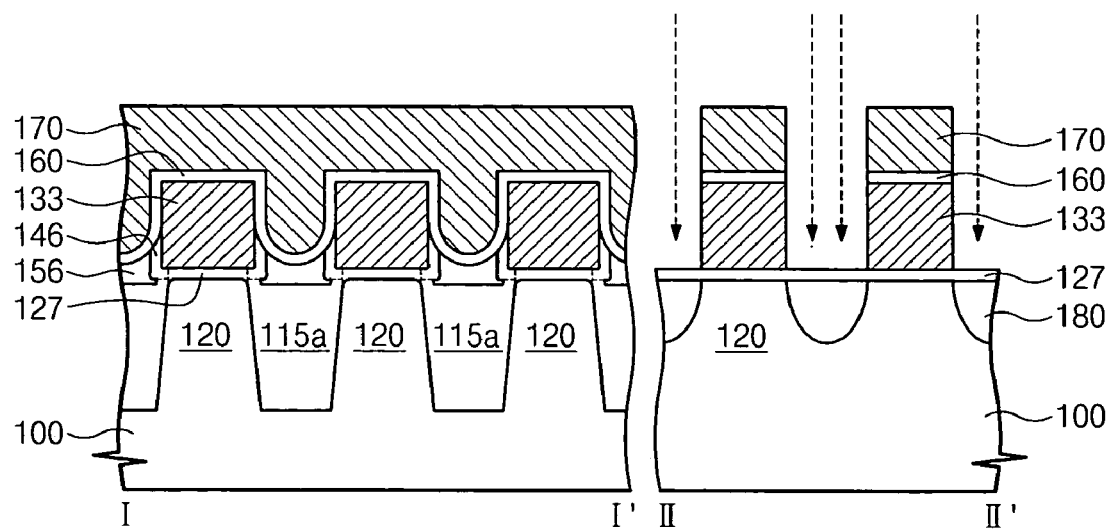

Referring to FIG. 13, a dielectric layer (not shown) may be conformally formed on the first conductive pattern 130, the first oxide pattern 146 and the second oxide pattern 156. A second conductive layer (not shown) may be formed on the dielectric layer. The second conductive layer may include the same material as the first conductive pattern 130 or different material. The second conductive layer, the dielectric layer and the first conductive pattern 130 may be patterned in a direction that crosses the active region 120 to form a control gate line 170, a gate interlayer dielectric layer 160 and a floating gate 133.

Impurity regions 180 may be formed by implanting impurities into the active regions using the floating gates 133 and the control gate lines 170 as a mask.

Figure 16:
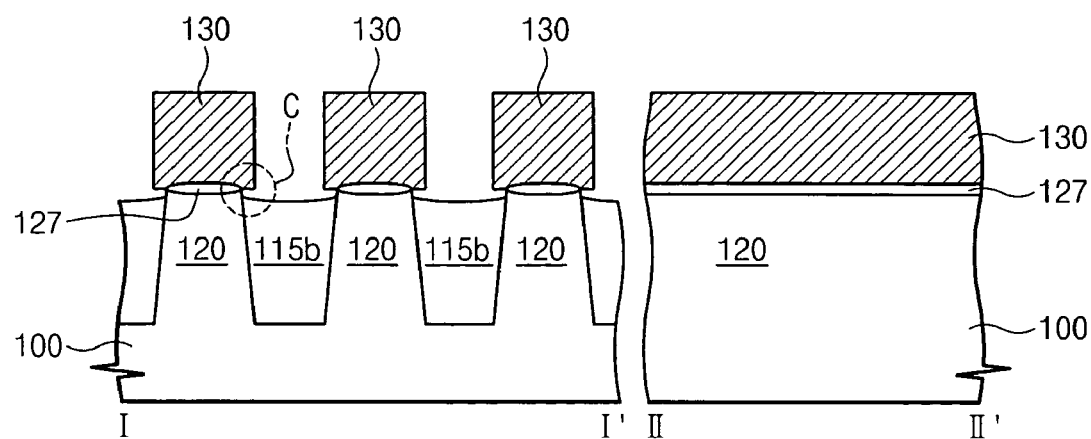
FIGS. 16 through 18 are cross-sectional views, taken along lines I-I' and II-II' of FIG. 1, illustrating a method of forming a semiconductor device of FIG. 3 in accordance with some embodiments of the present invention.
Figure 17:
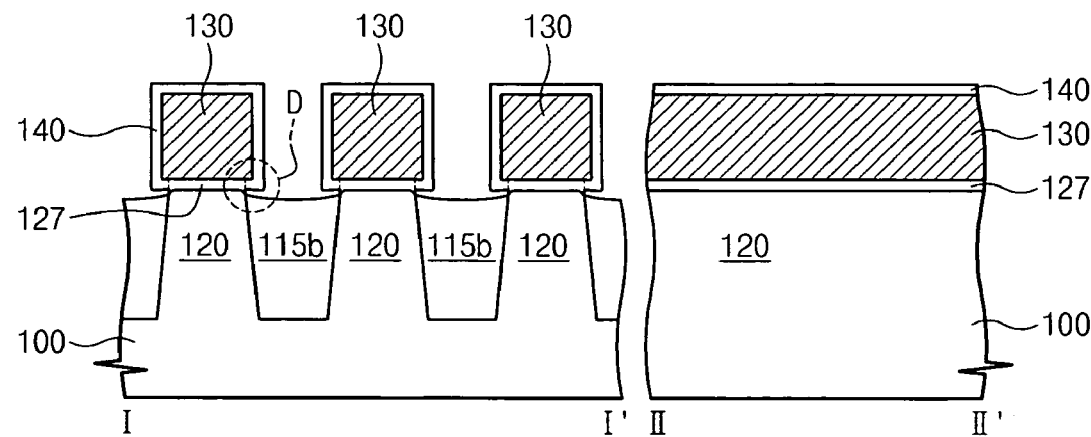
Figure 18:
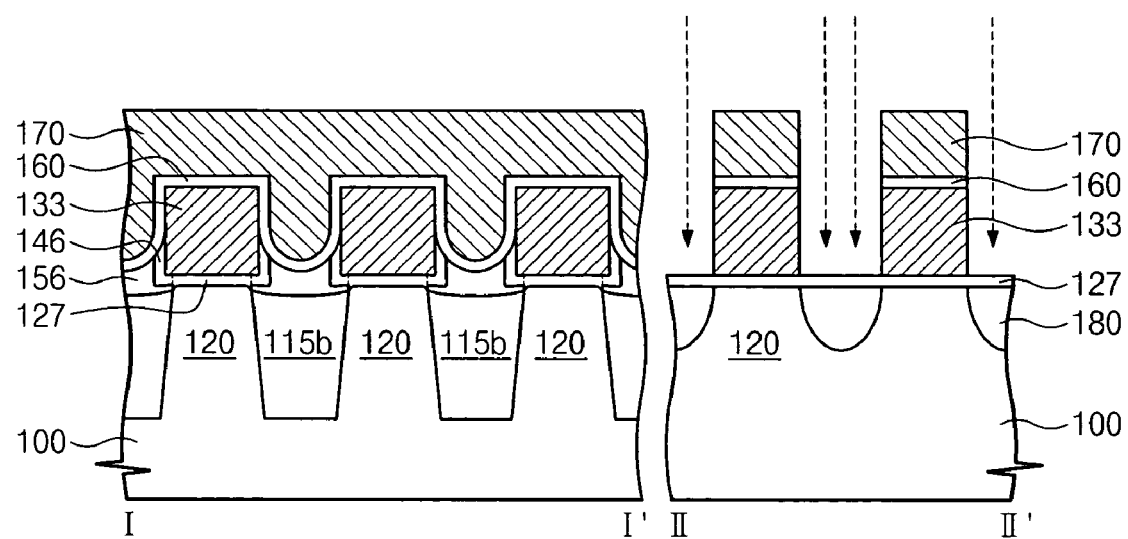

Referring to FIGS. 16 to 18, a method of forming a semiconductor device in accordance with some embodiments of the present invention will be described. The description of common features already discussed above will not be repeated.

Figure 19:
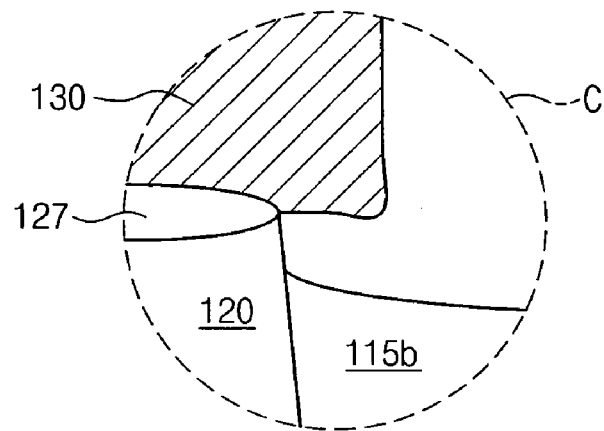
FIG. 19 is an enlarged view of Region C in FIG. 16.

Referring to FIGS. 16 and 19, a recess process is performed on the device isolation layer 115 of FIG. 8 to expose a sidewall of the first conductive pattern 130. The recess process may include an isotropic etching process. A device isolation insulating pattern 115b that has a top surface lower than a top surface of the active region 120 and exposes a portion of an upper side of the active region 120 may be formed by the isotropic etching process.

Figure 20:
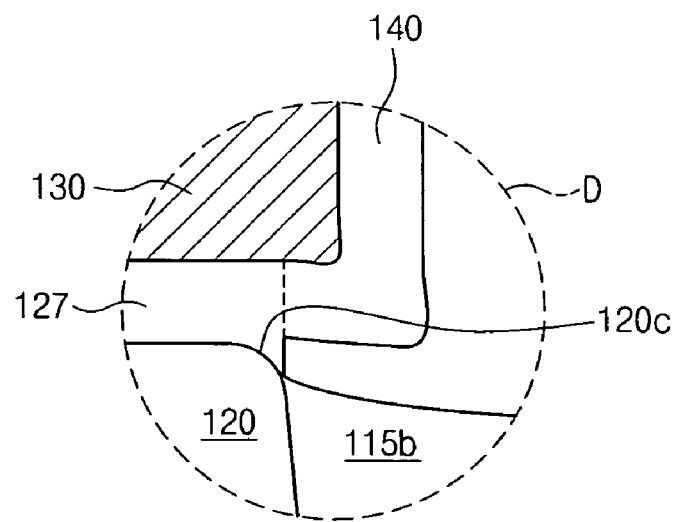
FIG. 20 is an enlarged view of Region D in FIG. 17.

Referring to FIGS. 17 and 20, a reoxidation process may be performed on a resultant structure of the above process. The reoxidation process may include a radical oxidation process or a thermal oxidation process. By the reoxidation process, a first oxide layer 140 may be formed on a surface of the first conductive pattern 130 and an edge 120c of the active region 120 may be oxidized. Thus, the edge 120c of the active region 120 may have a curved shape.

The radical oxidation may be performed using the same process as described above. The thermal oxidation process may use an oxygen ($O_2$) gas and may be performed in the range of about 750° C.~1100° C. The range of temperature may be selected considering a reaction velocity of an oxide layer. The thermal process may be performed in a furnace.

Referring to FIG. 18, using the same method as described above, a first oxide pattern 146 and a second oxide pattern 156 may be formed, and a floating gate 133, a gate interlayer dielectric layer 160, a control gate line 170 and an impurity region 180 may be formed.

The substrate may include a peripheral region and a peripheral transistor may be formed on the peripheral region. An interconnection process such as forming a contact hole and forming a bit line may also be performed.

In the above embodiments, the recess process for forming the device isolation insulating pattern 115a or 115b may include at least one anisotropic etching process or one isotropic etching process. The recess process may also be performed by sequentially repeating an anisotropic etching process and an isotropic etching process. The repeating number of the etching process may be variously controlled.

In the above embodiments, a shape of the floating gate may be variously changed.

Figure 21:
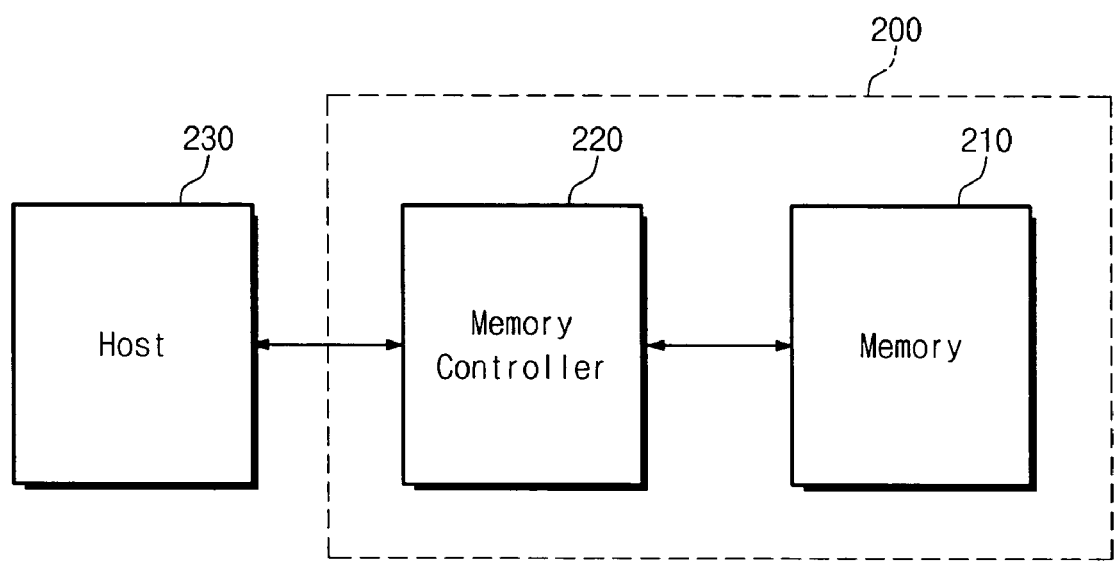
FIG. 21 is a block diagram showing a memory system including a semiconductor device in accordance with some embodiments of the present invention.

A semiconductor device according to the present invention may include a flash memory. Hereinafter, referring to FIG. 21, a memory system including a flash memory according to the present invention will be described.

A memory system 200 may include a flash memory device 210 for storing large amounts of data and a memory controller 220. The memory controller 220 controls the memory flash device 210 in response to a request for reading/writing of a host 230 so that requested data is written to the flash memory device 210 or requested data is read from the flash memory device 210. The memory controller 220 may constitute an address mapping table that maps an address provided from the host 230 (a mobile or a computer system) to an address of the flash memory device 210.

Figure 22:
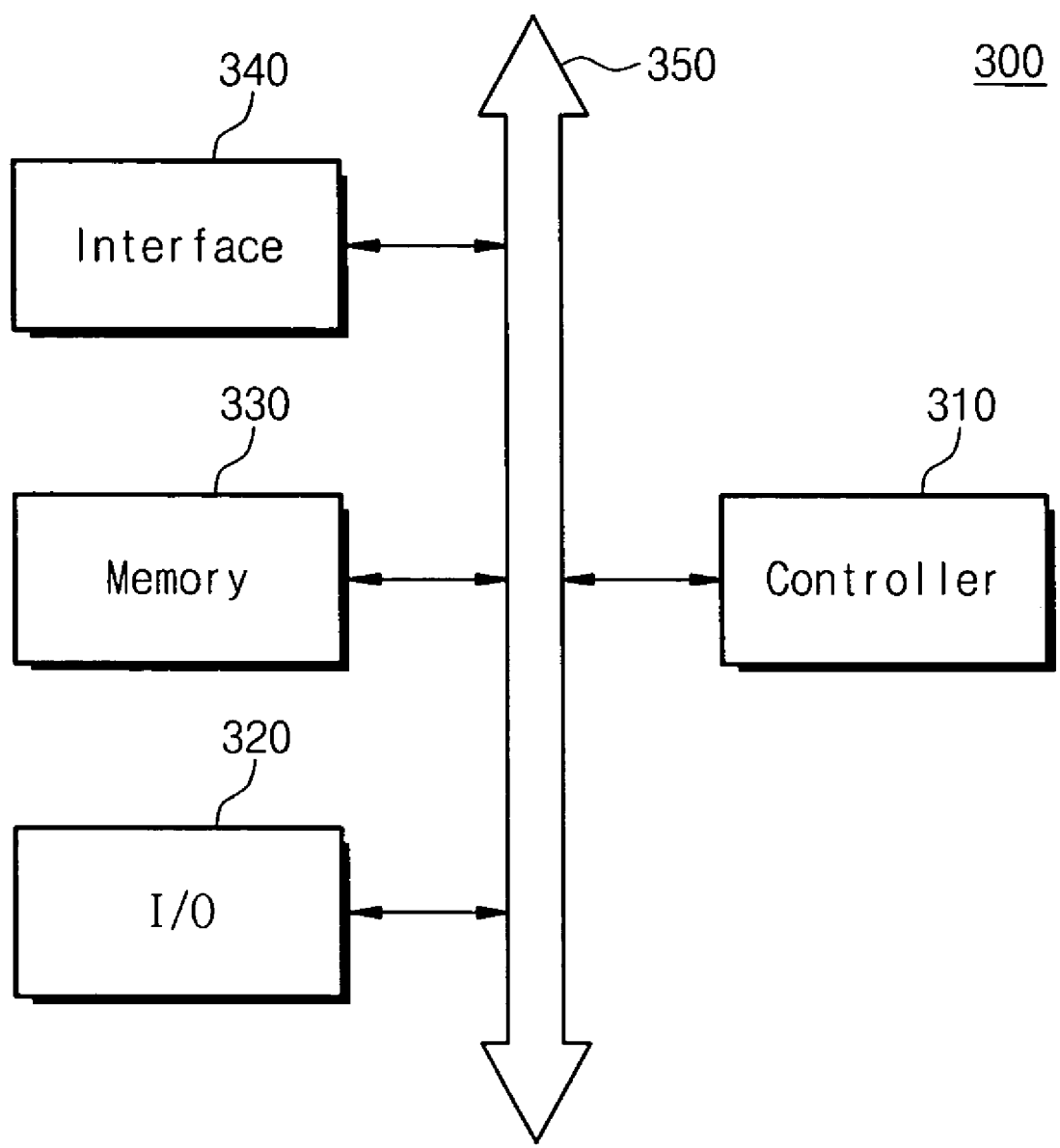
FIG. 22 is a block diagram showing an electronic device including a semiconductor device in accordance with some embodiments of the present invention.

Referring to FIG. 22, an electronic device including a semiconductor device in accordance with some embodiments of the present invention will be described. The electronic device 300 may be used in a wireless communication device such as a personal digital assistant (PDA), a laptop computer, a mobile computer, a web tablet, a wireless phone, a mobile phone, a digital music player, or all devices that can transmit and/or receive information in a wireless circumstance.

The electronic device 300 may include a controller 310, an input/output device 320 such as a keypad, keyboard and a display, a memory 330 and a wireless interface which are coupled through a bus 350. The controller 310 may include at least one microprocessor, one digital signal processor, one microcontroller or the like. The memory 330 may be used for storing an instruction executed by the controller 310. The memory 330 may also be used for storing a user data. The memory 330 may include a semiconductor device in accordance with some embodiments of the present invention.

The electronic device 300 may use a wireless interface 340 so as to transmit data to a wireless communication network that communicates with RF signal or receive data from the wireless communication network. The wireless interface 340 may include an antenna, a wireless transceiver, and so on.

The electronic device 300 according to some embodiments of the present invention may be used in a communication interface protocol of third generation communication system such as CDMA, GSM, NADC, E-TDMA, WCDMA and CDMA2000.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device, comprising:
 a conductive line on a substrate extending in a direction that crosses active regions defined by a device isolation insulating pattern in the substrate, wherein a portion of an upper side of the active regions is exposed by the device isolation insulating pattern;
 conductive patterns disposed on a position at which the active regions and the conductive line cross each other;
 a first insulating layer disposed between the conductive patterns and the active regions;
 a first oxide pattern disposed on a lower sidewall of the conductive patterns;
 a second oxide pattern that is in contact with the first oxide pattern and disposed on the device isolation insulating pattern; and
 a second insulating layer disposed between the conductive patterns and the conductive line, between the first oxide pattern and the conductive line, and between the second oxide pattern and the conductive line, wherein the second insulating layer is in contact with the first oxide pattern.

2. A method of forming a semiconductor device, comprising:
 providing a substrate including a first insulating layer and conductive patterns stacked on active regions which are defined by a device isolation insulating pattern and extend in a specific direction;
 performing an oxidation process to form a first oxide layer on a surface of the conductive patterns;
 forming a second oxide layer between the conductive patterns;
 performing a recess process on the first and second oxide layers to form a first oxide pattern and a second oxide pattern on the device isolation insulating pattern; and
 forming a second insulating layer and a conductive layer on the conductive patterns, the first oxide pattern and the second oxide pattern.

3. The method of claim 2, wherein performing the oxidation process comprises performing a thermal oxidation process, the thermal oxidation oxidizing an edge of the active regions.

4. The method of claim 3, wherein a portion of an upper side of the active regions is exposed.

5. The method of claim 2, wherein performing the oxidation process comprises performing a radical oxidation process, the radical oxidation oxidizing an edge of the active regions.

6. The method of claim 5, wherein an upper side of the active regions is covered with the device isolation insulating pattern.

7. The method of claim 2, wherein providing the substrate comprises:
 forming a trench in the substrate by recessing the substrate using a mask pattern;
 forming a device isolation insulating layer having the same height as the mask pattern and filling the trench;
 removing the mask pattern to expose the active regions;
 forming the first insulating layer on the active regions;
 forming the conductive patterns on the first insulating layer; and
 forming the device isolation insulating pattern by recessing the device isolation insulating layer to expose sidewalls of the conductive patterns.

8. The method of claim 7, wherein forming the device isolation insulating pattern comprises etching the device isolation insulating layer so that a recessed surface of the device isolation insulating layer is lower than a top surface of the active regions.

9. The method of claim 7, wherein removing the mask pattern to expose the active region comprises forming an opening having a width greater than a width of the mask pattern.

10. The method of claim 2, wherein forming the second oxide layer comprises a chemical vapor deposition process.

11. The method of claim 10, wherein forming the second oxide layer comprises an annealing process.

12. The method of claim 2, wherein performing the recess process comprise etching the second oxide layer faster than the first oxide layer.

* * * * *